United States Patent [19]

Guyton

[11] 3,812,381

[45] May 21, 1974

[54] CIRCUIT BOARD CONNECTOR WITH SCREW FASTENER

[75] Inventor: James H. Guyton, Kokomo, Ind.

[73] Assignee: General Motors Corporation, Detroit, Mich.

[22] Filed: June 4, 1973

[21] Appl. No.: 366,654

[52] U.S. Cl. ...... 317/101 D, 317/101 CC, 339/267, 339/17 LC

[51] Int. Cl. .............................................. H05k 5/00

[58] Field of Search317/101 CM, 101 CC, 101 DH, 317/101 D; 339/267, 17 LC, 17 LM, 17 L, 17 C; 174/68.5

[56] References Cited

UNITED STATES PATENTS

| | | | |
|---|---|---|---|
| 2,593,981 | 4/1952 | Capita | 339/267 |
| 3,196,318 | 7/1965 | Richardson | 317/101 D |
| 3,131,330 | 4/1964 | Allen | 317/101 DH |
| 2,910,672 | 10/1959 | La Patka | 317/101 D |

*Primary Examiner*—David Smith, Jr.
*Attorney, Agent, or Firm*—Warren D. Hill

[57] ABSTRACT

Two spaced parallel electrical circuit boards are electrically interconnected by a fastener comprising two tubular eyelets one each soldered to a conductive pad on a circuit board, one eyelet telescoping within the other and having a shoulder for establishing the circuit board spacing. The inner eyelet is slotted to allow expansion against the I.D. of the other eyelet. A self-tapping screw is threaded into the inner eyelet to force it against the wall of the other eyelet to establish a firm engagement to securely connect the circuit boards with minimal stress on the circuit boards.

4 Claims, 2 Drawing Figures

CIRCUIT BOARD CONNECTOR WITH SCREW FASTENER

Figure 1:
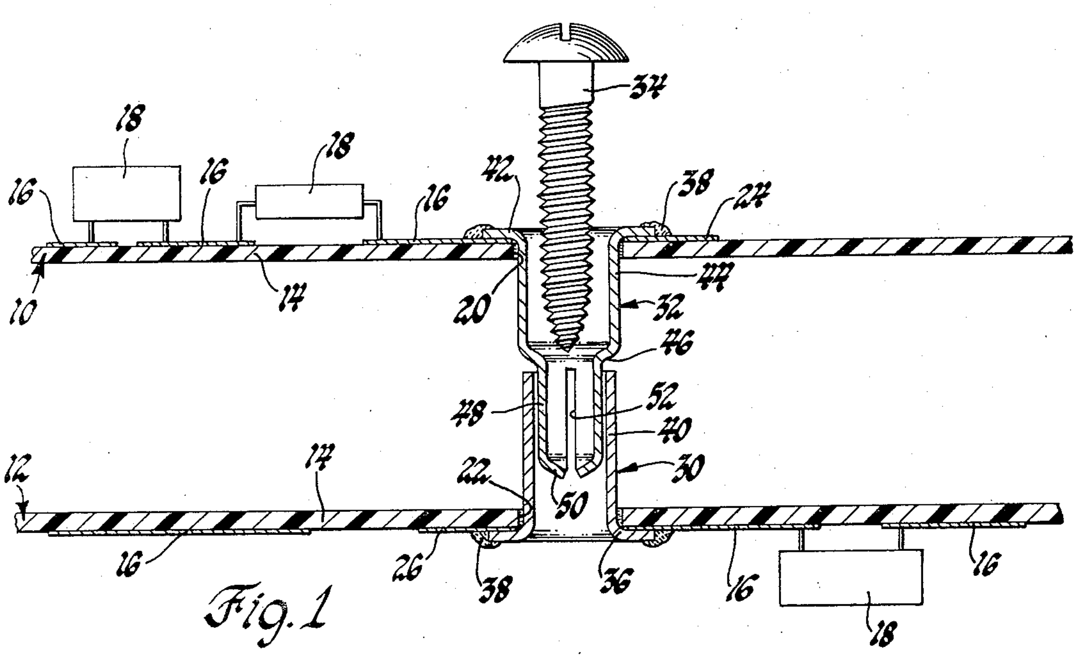

This invention relates to a connector for reliably electrically interconnecting a pair of spaced circuit boards.

Modular assembly of electronic systems becomes very desirable as the complexity of the system increases. A functional module composed of several components can be pretested before assembly at the factory and such a system can be serviced with a minimum of knowledge on the part of the repairman. Modularized electronic systems require a large number of interconnections which must be reliable to preserve the function of the system. Many of the conventional interconnection techniques used with printed circuit boards have unreliable connections because of wide variations in contact pressure during thermal expansion and contraction accompanied by variations in contact resistance.

It is therefore an object of this invention to provide a reliable interconnection between spaced parallel circuit boards.

It is a further object to provide such a connection having a very high contact pressure which pressure is not transmitted to the circuit board itself.

The invention is carried out by providing a pair of spaced circuit boards with tubular eyelets mechanically and electrically connected to each board and telescopically mating with each other, and a screw driven into the inner eyelet to radially expand that eyelet into firm engagement with the other eyelet.

Figure 2:
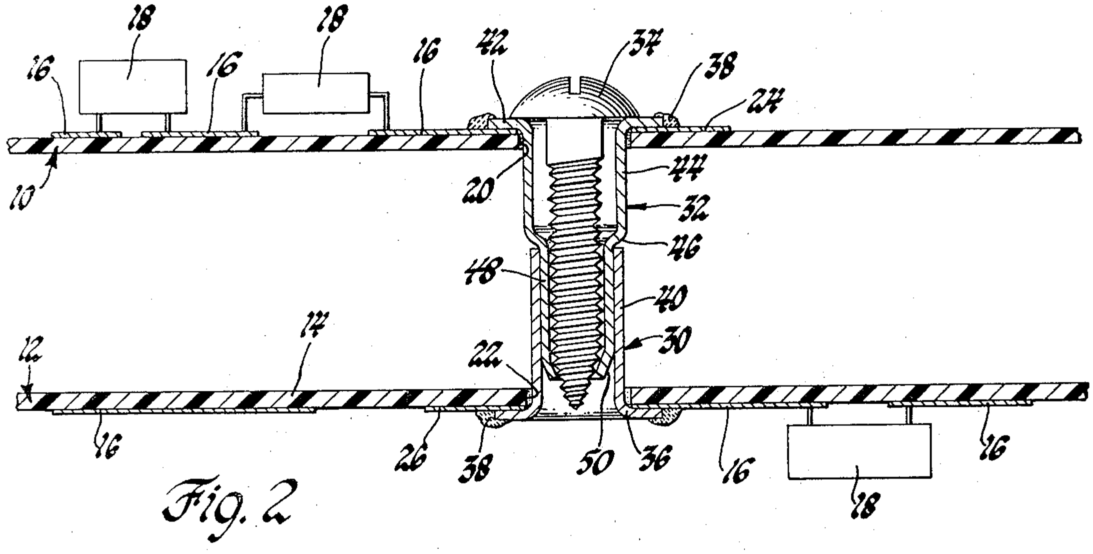

The above and other advantages will be made more apparent from the following specification taken in conjunction with the accompanying drawings wherein like reference numerals refer to like parts and wherein:

FIG. 1 is a exploded cross-sectional view of a circuit board connector according to the invention, and FIG. 2 is a cross-sectional view of the connector of FIG. 1 shown in assembled position.

Referring to FIG. 1, a pair of spaced parallel circuit boards 10 and 12 each comprise an insulating support portion 14 carrying electrical conductors 16 which form electrical interconnections between components 18. The circuit boards 10 and 12 are provided with aligned apertures 20 and 22 respectively. located in an area wherein electrical interconnection between the circuit boards is required. The apertures 20 and 22 are surrounded by conductive contact pads 24 and 26 which comprise an integral portion of some of the electrical conductors 16.

The connector for interconnecting the circuit boards comprises mating tubular eyelets 30 and 32 and a screw 34. The eyelet 30 has one end terminating in an outwardly flared flange 36 secured to the contact pad 26 by solder 38 and has a sleeve or shank portion 40 extending through the aperture 22 toward the circuit board 10. The eyelet 32 comprises a flange portion 42 secured to the contact pad 24 by solder 38 and has a sleeve or shank portion 44 extending through the aperture 20 toward the circuit board 12. The shank portion 44 at its midpoint is necked down to define a shoulder 46 and a terminal portion 48 of reduced cross section which terminates in a tapered tip 50. One or more longitudinal slots 52 are formed in the terminal portion 48 to allow expansion thereof.

When assembled as shown in FIG. 2, the terminal portion 48 of the eyelet 32 is inserted into the shank portion 40 of the eyelet 30 until the shoulder 46 engages the shank end of the eyelet 30. The tapered tip 50 on the terminal portion 48 assists in guiding insertion of the one eyelet into the other. The screw 34 is driven into the terminal portion 48 by a screwdriver to expand the terminal portion 48 against the inner wall of the shank portion 40. The diameter of the screw 34 which is preferably of the self-tapping variety is selected to provide a very firm metal-to-metal contact between the two eyelets thereby providing a reliable interconnection between the circuit boards. It should be apparent that very high contact pressures may be realized, yet the contact pressure is not transmitted through the material of the circuit boards 10 and 12 nor is the contact pressure greatly affected by thermal cycling since the eyelets are preferably formed of similar metals. An additional feature of the connector according to this invention is that the slotted portion 52 allows expansion of the terminal portion 48 into good contact with the eyelet 30, even if there is slight misregistration of the eyelets during assembly. This feature facilitates assembly since several eyelet connections may be used between each pair of circuit boards and all must be in rough alignment simultaneously. It should further be seen that easy disassembly of the circuit boards may be achieved by removal of the screw in each connector.

An alternate form of the invention contemplates the omission or modification of the tapered tip 50 to allow insertion of the screw through the eyelet 30 into the terminal portion 48.

The embodiment of the invention described herein is for purposes of illustration and the scope of the invention is intended to be limited only by the following claims.

It is claimed:

1. A connector for electrically interconnecting a pair of circuit boards mounted in spaced parallel relationship with a minimum of stress on the circuit boards comprising a first tubular eyelet attached at one end to a conductor on a first circuit board and having a shank portion extending toward a second circuit board, a second tubular eyelet attached at one end to a conductor on the second circuit board and having a shank portion telescopically disposed within the shank portion of the first tubular eyelet, and means for expanding the shank portion of the second eyelet into fixed engagement with the shank portion of the first eyelet comprising a threaded fastener axially screwed into the shank portion of the second eyelet, whereby the circuit boards are securely electrically interconnected.

2. A connector as defined in claim 1 wherein one of the shank portions includes a shoulder engaging the end of the other shank portion for limiting the extent of telescopic insertion of the shank portion of the second eyelet, thereby fixing the spacing between the circuit boards.

3. A connector for electrically interconnecting a pair of circuit boards mounted in spaced parallel relationship with a minimum of stress on the circuit boards comprising a first tubular eyelet attached at one end to a conductor on a first circuit board and having a shank portion extending toward a second circuit board, a second tubular eyelet attached at one end to a conductor on the second circuit board and having a shank portion extending toward the first circuit board, the shank portion of the second eyelet having a shoulder portion intermediate its ends for axial engagement with the shank portion of the first eyelet and having a terminal portion of reduced cross section inserted into the shank portion of the first eyelet, the terminal portion being longitudinally slotted to facilitate expansion thereof against the shank portion of the second eyelet, and a threaded fastener means inserted within the second eyelet and axially screwed into the terminal portion thereof for expanding the terminal portion into fixed engagement with the shank portion of the first eyelet, whereby the circuit boards are securely electrically interconnected.

4. A connector as described in claim 3 wherein the circuit boards have aligned apertures for receiving the respective eyelets, the conductor on each circuit board having a conductive pad surrounding the aperture on that circuit board, and each eyelet having an outwardly flared flange at its said one end soldered to the conductive pad on its respective circuit board.

* * * * *